(12) United States Patent
Kitagawa et al.

(10) Patent No.: US 8,952,472 B2
(45) Date of Patent: Feb. 10, 2015

(54) SEMICONDUCTOR DEVICE USING CLOSE PROXIMITY WIRELESS COMMUNICATION

(75) Inventors: Daisaku Kitagawa, Osaka (JP); Takeshi Nakayama, Hyogo (JP); Masahiro Ishii, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 65 days.

(21) Appl. No.: 13/513,923

(22) PCT Filed: Oct. 4, 2011

(86) PCT No.: PCT/JP2011/005599
§ 371 (c)(1),
(2), (4) Date: Jun. 5, 2012

(87) PCT Pub. No.: WO2012/049821
PCT Pub. Date: Apr. 19, 2012

(65) Prior Publication Data
US 2012/0241888 A1  Sep. 27, 2012

(30) Foreign Application Priority Data

Oct. 13, 2010 (JP) .................................. 2010-230184

(51) Int. Cl.
*H01Q 7/00* (2006.01)
*G01R 31/302* (2006.01)

(52) U.S. Cl.
CPC .............. *H01Q 7/00* (2013.01); *G01R 31/3025* (2013.01)
USPC .................................. 257/428; 257/E23.079

(58) Field of Classification Search
USPC ........................................... 257/428, E23.079
IPC ........................................................ H01Q 7/00
See application file for complete search history.

(56) References Cited

U.S. PATENT DOCUMENTS

| 2006/0019711 A1 | 1/2006 | Hashimoto |
| 2007/0024504 A1 | 2/2007 | Matsunaga |
| 2007/0159210 A1 | 7/2007 | Sato |

(Continued)

FOREIGN PATENT DOCUMENTS

| JP | 62-294327 | 12/1987 |
| JP | 6-294843 | 10/1994 |

(Continued)

OTHER PUBLICATIONS

International Search Report issued Nov. 8, 2011 in corresponding International Application No. PCT/JP2011/005599.

(Continued)

*Primary Examiner* — Tony Tran
(74) *Attorney, Agent, or Firm* — Wenderoth, Lind & Ponack, L.L.P.

(57) ABSTRACT

The present invention provides a semiconductor device capable of changing the setting of the internal operation mode without increasing the number of terminals of the semiconductor device. The semiconductor device includes a transmitting cell, a receiving cell, a semiconductor chip including a transmitting antenna and a receiving antenna, and a conductor. The transmitting antenna is connected to the transmitting cell, and the receiving antenna is connected to the receiving cell. The conductor is provided close to the transmitting antenna and the receiving antenna. Close proximity wireless communication is used between the transmitting cell and the receiving cell.

5 Claims, 11 Drawing Sheets

(56) References Cited

U.S. PATENT DOCUMENTS

| | | |
|---|---|---|
| 2007/0289772 A1 | 12/2007 | Kuroda et al. |
| 2008/0191883 A1* | 8/2008 | Imaichi et al. ............ 340/572.5 |
| 2009/0245445 A1 | 10/2009 | Saen et al. |

FOREIGN PATENT DOCUMENTS

| | | |
|---|---|---|
| JP | 2004/119921 | 4/2004 |
| JP | 2005-228981 | 8/2005 |
| JP | 2006-60786 | 3/2006 |
| JP | 2007-171060 | 7/2007 |
| JP | 4131544 | 8/2008 |
| JP | 2010-109110 | 5/2010 |
| WO | 02/091616 | 11/2002 |

OTHER PUBLICATIONS

Extended European Search Report issued Jun. 18, 2014 in corresponding European Application No. 11832266.8.

Chang M-C F et al., "Advanced RF/Baseband Interconnect Schemes for Inter- and Intra-ULSI Communications", IEEE Transactions on Electron Devices, IEEE Service Center, Piscataway, NJ, US, vol. 52, No. 7, Jul. 1, 2005, pp. 1271-1285, XP011135486, ISSN: 0018-9383, DOI: 10.1109/TED.2005.850699.

* cited by examiner

SEMICONDUCTOR DEVICE USING CLOSE PROXIMITY WIRELESS COMMUNICATION

TECHNICAL FIELD

The present invention relates to a technology for setting an operation mode and the like of a semiconductor device by using close proximity wireless communication.

BACKGROUND ART

In semiconductor devices, of which a large scale integrated circuit (LSI) is representative, the setting of the internal operation mode is changed depending on circumstances. For example, a semiconductor device is set to the test mode while an operation test of the semiconductor device is conducted before shipping (Patent Literature 1). In addition, an operation mode may be set when a semiconductor device is shipped according to a memory or an input/output device of a household electrical appliance and the like on which the semiconductor device will be mounted. Also, in order to support different types of household electrical appliances, the semiconductor device may be provided with different operation modes.

Generally, the setting described above is performed via an external connection terminal of the semiconductor device changes. For example, the semiconductor device includes a dedicated terminal for setting the test mode. In order to set the semiconductor device to the test mode, a high (H) level voltage or a low (L) level voltage is applied to the dedicated terminal. In this way, the semiconductor device is set to the test mode.

CITATION LIST

Patent Literature

[Patent Literature 1]
Japanese Patent Application Publication No. 2007-171060
[Patent Literature 2]
Japanese Patent No. 4131544

SUMMARY OF INVENTION

Technical Problem

In recent years, as the number of functions of a semiconductor device is increasing, the number of necessary terminals is increasing. On the other hand, as an advance in semiconductor miniaturization is made, the size of a package is decreasing, and accordingly the number of terminals that can be provided on the semiconductor device is decreasing. Consequently, there is a problem in that it is becoming difficult to provide a dedicated terminal for the mode setting.

The present invention aims to provide a semiconductor device that is able to change the setting of the internal operation mode without increasing the number of terminals of the semiconductor device.

Solution to Problem

In order to solve the above problem, the present invention provides a semiconductor device comprising: a semiconductor chip including a transmitting cell, a receiving cell, a first antenna connected to the transmitting cell, and a second antenna connected to the receiving cell; and a conductor disposed close to the first antenna and the second antenna, wherein the transmitting cell and the receiving cell communicate with each other using close proximity wireless communication.

Advantageous Effects of Invention

The above structure has the advantageous effect of changing the setting of the internal operation mode without increasing the number of terminals of the semiconductor device.

BRIEF DESCRIPTION OF DRAWINGS

FIG. 2 is an exploded view of the semiconductor device 100a.

FIG. 3 is a cross-sectional view of the semiconductor device 100a.

FIG. 4 is a block diagram showing a structure of a semiconductor chip 120 of the semiconductor device 100a.

FIG. 8 shows relation between the positions of conductors on the propagation plate 101a and another device mounted on a circuit substrate 10a.

DESCRIPTION OF EMBODIMENTS

1. Embodiment 1

A semiconductor device 100a as one embodiment pertaining to the present invention is described below.

1.1 Semiconductor Device 100a

Figure 1:
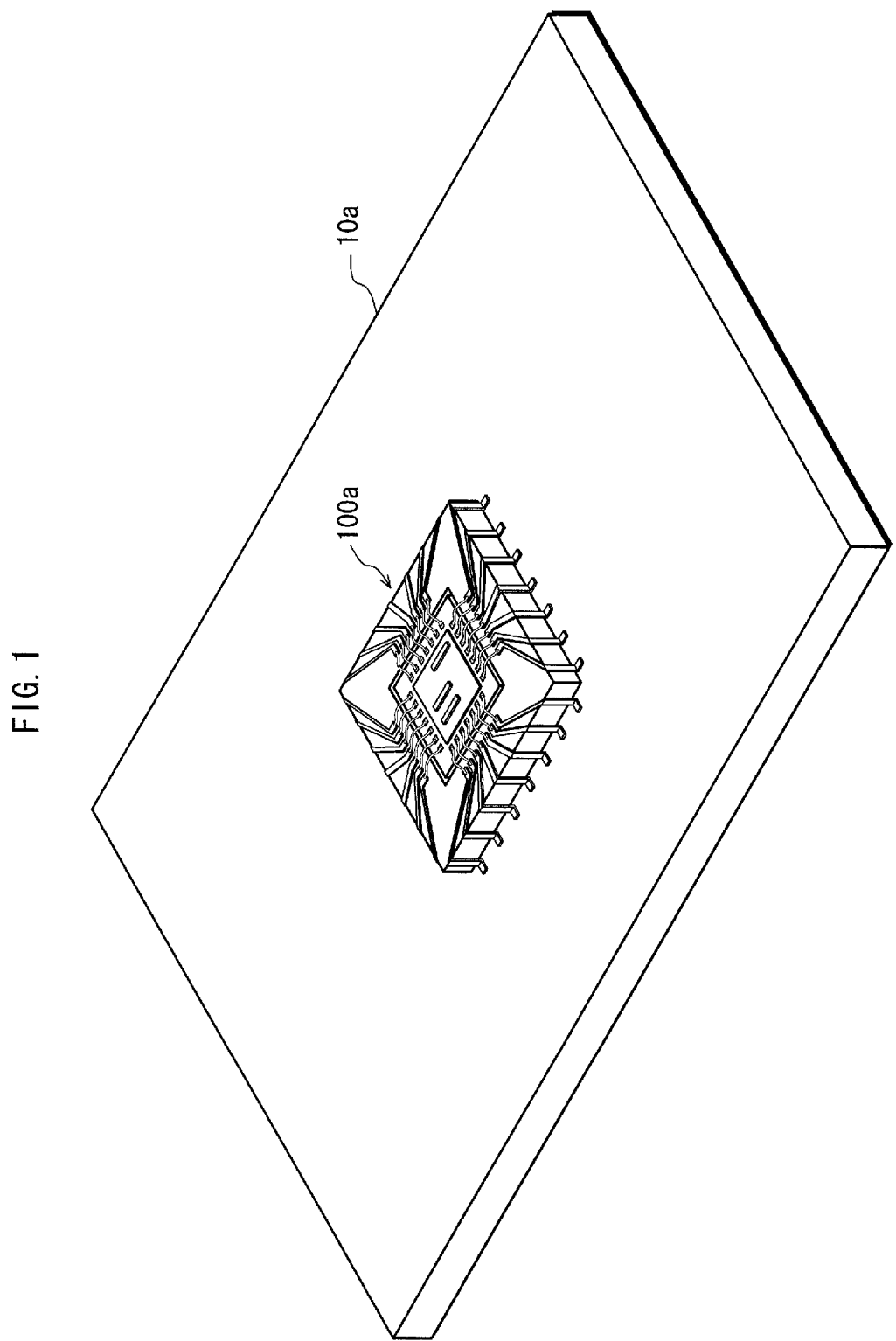
FIG. 1 is a perspective view showing the appearance of a semiconductor device 100a pertaining to Embodiment 1.
Figure 2:
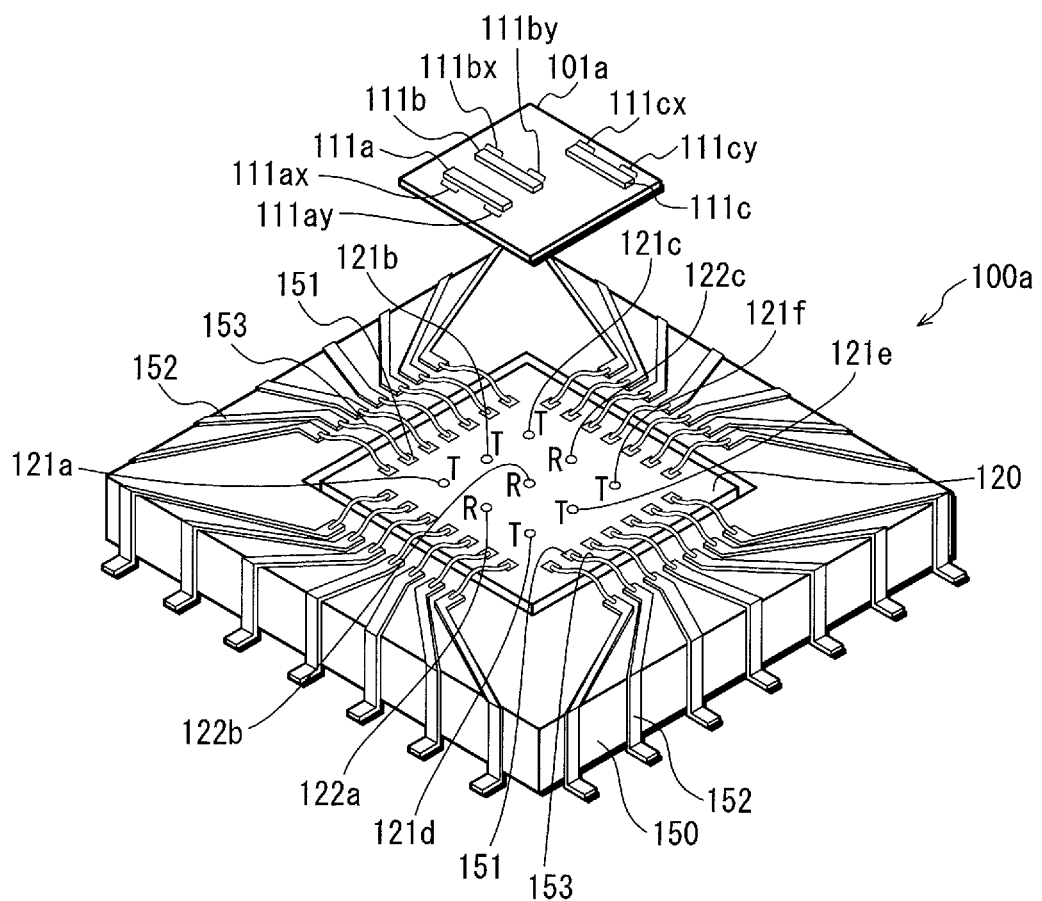

As shown in FIG. 1, the semiconductor device 100a is mounted on a circuit substrate 10a along with other unillustrated electronic components. As shown in FIG. 2, the semiconductor device 100a is composed of a sheet-like propagation plate 101a, a semiconductor chip 120, and a package 150. The propagation plate 101a adheres to the upper surface of the semiconductor chip 120. The package 150 surrounds the semiconductor chip 120 to provide protection.

Figure 3:
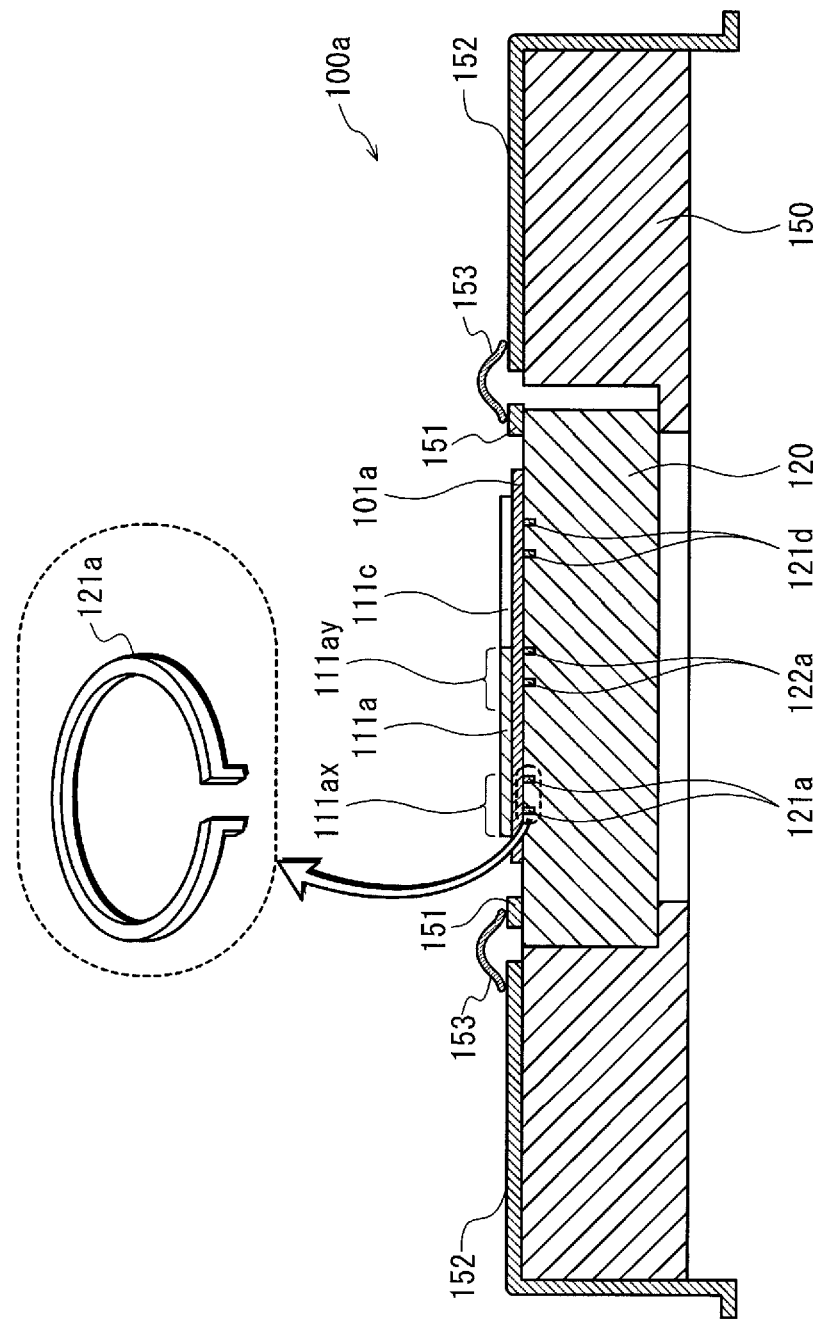

As shown in FIGS. 2 and 3, a plurality of bonding pads (electrodes) 151 are provided on the upper surface of the semiconductor chip 120 along the four sides thereof in a square shape. The plurality of bonding pads 151 are connected to a plurality of leads 152 via a plurality of bonding wires 153. Each lead 152 extends in contact with the upper surface of the package 150, and is bent downward at the end of the upper surface to extend in contact with the side surface of the package 150. The plurality of leads 152 connect the semiconductor chip 120 and the circuit substrate 10a.

As shown in FIGS. 2 and 3, on the upper surface of the semiconductor chip 120, transmitting antennas 121a, 121b and 121c, receiving antennas 122a, 122b and 122c, and transmitting antennas 121d, 121e, and 121f are provided in a matrix within the square shape formed by the plurality of bonding pads 151. The transmitting antennas 121a, 121b and 121c, the receiving antennas 122a, 122b and 122c, and the transmitting antennas 121d, 121e, and 121f are formed inside the semiconductor chip 120 so that the upper part of each antenna is exposed outside of the upper surface of the semiconductor chip 120.

Note that the cross section shown in FIG. 3 only shows the transmitting antennas 121a and 121d and the receiving antenna 122a that are formed inside the semiconductor chip 120, and other components inside the semiconductor chip 120 are omitted.

1.2 Propagation Plate 101a

As shown in FIGS. 2 and 3, the propagation plate 101a is a sheet-like (plate-like) signal propagating plate made of a cellophane film, for example, and adheres to the upper surface of the semiconductor chip 120 with an acrylic adhesive within the square shape formed by the plurality of bonding pads 151. On the upper surface of the propagation plate 101a, conductors 111a, 111b and 111c are provided. The conductors 111a, 111b and 111c are made of Cu, for example, and are band-like conductive foils.

Before the propagation plate 101a adheres to the upper surface of the semiconductor chip 120, the conductors 111a, 111b and 111c have adhered to the upper part of the propagation plate 101a so that one end 111ax of the conductor 111a is close to the transmitting antenna 121a, the other end 111ay of the conductor 111a is close to the receiving antenna 122a, one end 111bx of the conductor 111b is close to the transmitting antenna 121b, the other end 111by of the conductor 111b is close to the receiving antenna 122b, one end 111cx of the conductor 111c is close to the receiving antenna 122c, and the other end 111cy of the conductor 111c is close to the transmitting antenna 121f.

The distance between the lower surface of each conductor and the upper surface of the semiconductor chip 120 is equal to or less than 1 mm.

Before the propagation plate 101a adheres to the upper surface of the semiconductor chip 120, there is no restriction on the positioning of the conductors on the propagation plate 101a, and the conductors may be provided in any manner. However, if both a transmitting antenna of the semiconductor chip 120 and a receiving antenna of the semiconductor chip 120 are not positioned right under each conductor, data cannot be transmitted from the transmitting antenna to the receiving antenna.

In addition, the number of transmitting antennas that can be positioned right under one conductor is only one. This is because if electrical signals from two or more transmitting antennas pass through the conductor, the electrical signals collide with each other and normal communication cannot be performed. In contrast, there is no logical restriction on the number of receiving antennas that can be positioned right under the conductor. Two or more receiving antennas may be provided right under the conductor. When two or more receiving antennas are positioned right under one conductor, each of the two or more receiving antennas can receive an electrical signal corresponding to a signal transmitted from one transmitting antenna.

Figure 6:
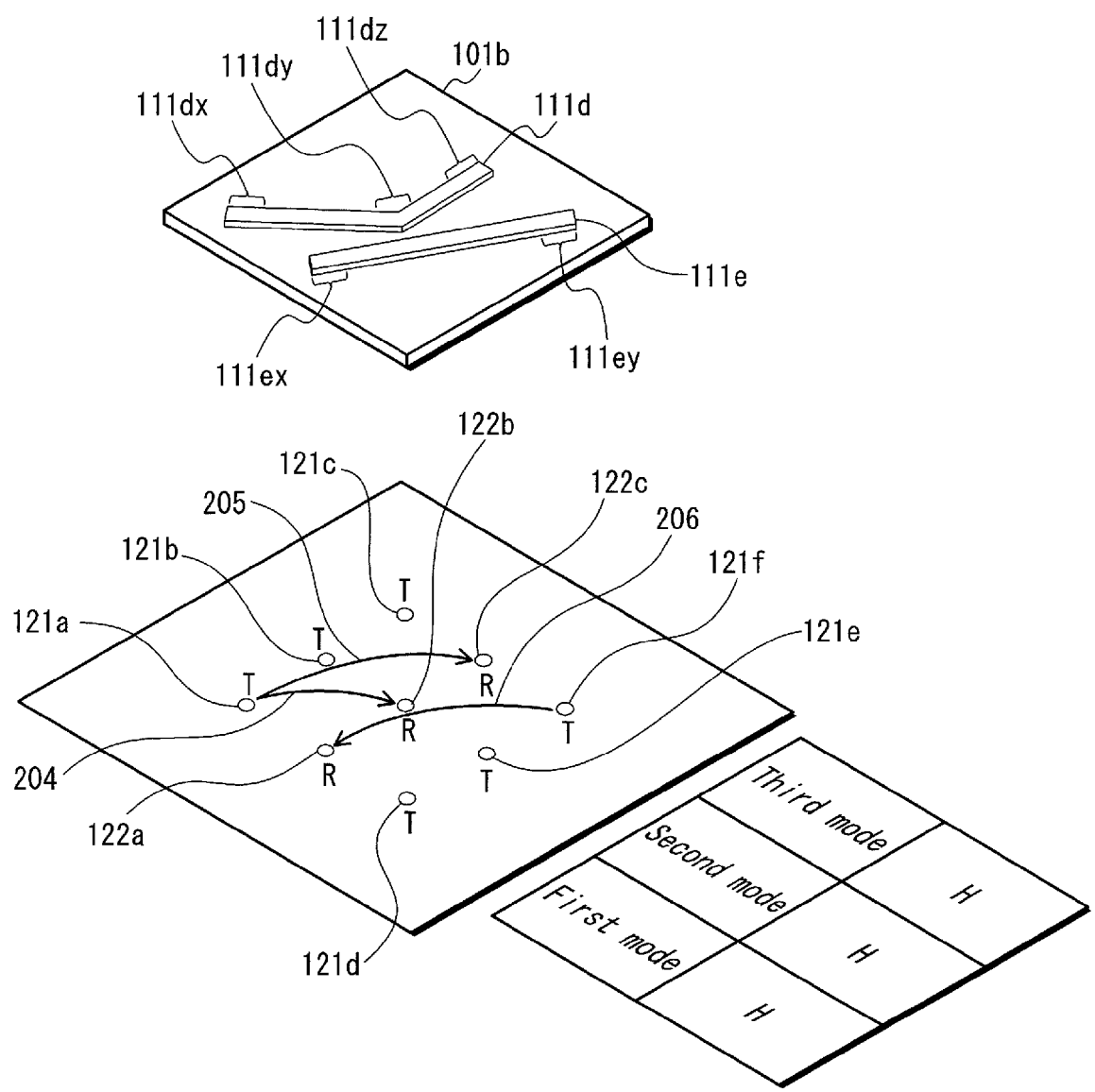
FIG. 6 shows relation between the positions of conductors 111d and 111e on a propagation plate 101b and connection paths of transmitting antennas and receiving antennas of the semiconductor chip 120.
Figure 7:
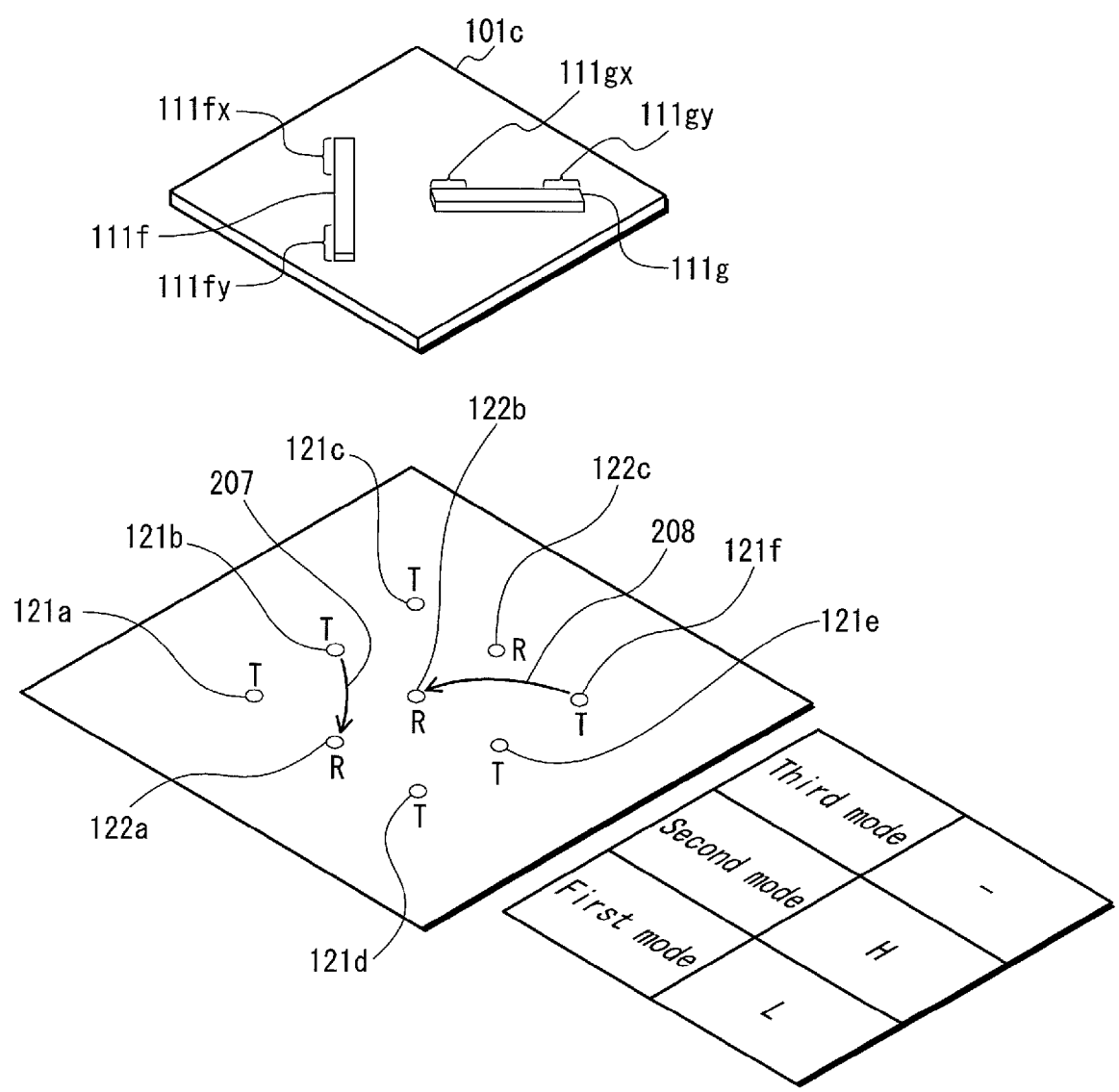
FIG. 7 shows relation between the positions of conductors 111f and 111g on a propagation plate 101c and connection paths of transmitting antennas and receiving antennas of the semiconductor chip 120.

FIGS. 6 and 7 show examples of propagation plates other than the propagation plate 101a.

A propagation plate 101b shown in FIG. 6 differs from the propagation plate 101a only in the number, shapes, and positioning of conductors provided thereon. On the upper surface of the propagation plate 101b, conductors 111d and 111e are provided. The conductors 111d and 111e are made of Cu, for example, and are band-like conductive foils like the conductor 111a and so on. The conductor 111d has a shape of a bent band, and the conductor 111e is rectangular like the conductor 111a and so on.

Before the propagation plate 101b adheres to the upper surface of the semiconductor chip 120, the conductors 111d and 111e have adhered to the upper surface of the propagation plate 101b so that one end 111dx of the conductor 111d is close to the transmitting antenna 121a, a central part 111dy (a part that is bent in the middle) of the conductor 111d is close to the receiving antenna 122b, the other end 111dz of the conductor 111d is close to the receiving antenna 122c, one end 111ex of the conductor 111e is close to the receiving antenna 122a, and the other end 111ey of the conductor 111e is close to the transmitting antenna 121f.

A propagation plate 101c shown in FIG. 7 differs from the propagation plate 101a only in the number and positioning of conductors provided thereon. On the upper surface of the propagation plate 101c, conductors 111f and 111g are provided. The conductors 111f and 111g are made of Cu, for example, and are band-like conductive foils like the conductor 111a and so on.

Before the propagation plate 101c adheres to the upper surface of the semiconductor chip 120, the conductors 111f and 111g have adhered to the upper surface of the propagation plate 101c so that one end 111fx of the conductor 111f is close to the transmitting antenna 121b, the other end 111fy of the conductor 111f is close to the receiving antenna 122a, one end 111gx of the conductor 111g is close to the receiving antenna 122b, and the other end 111gy of the conductor 111g is close to the transmitting antenna 121f.

1.3 Semiconductor Chip 120

Figure 4:
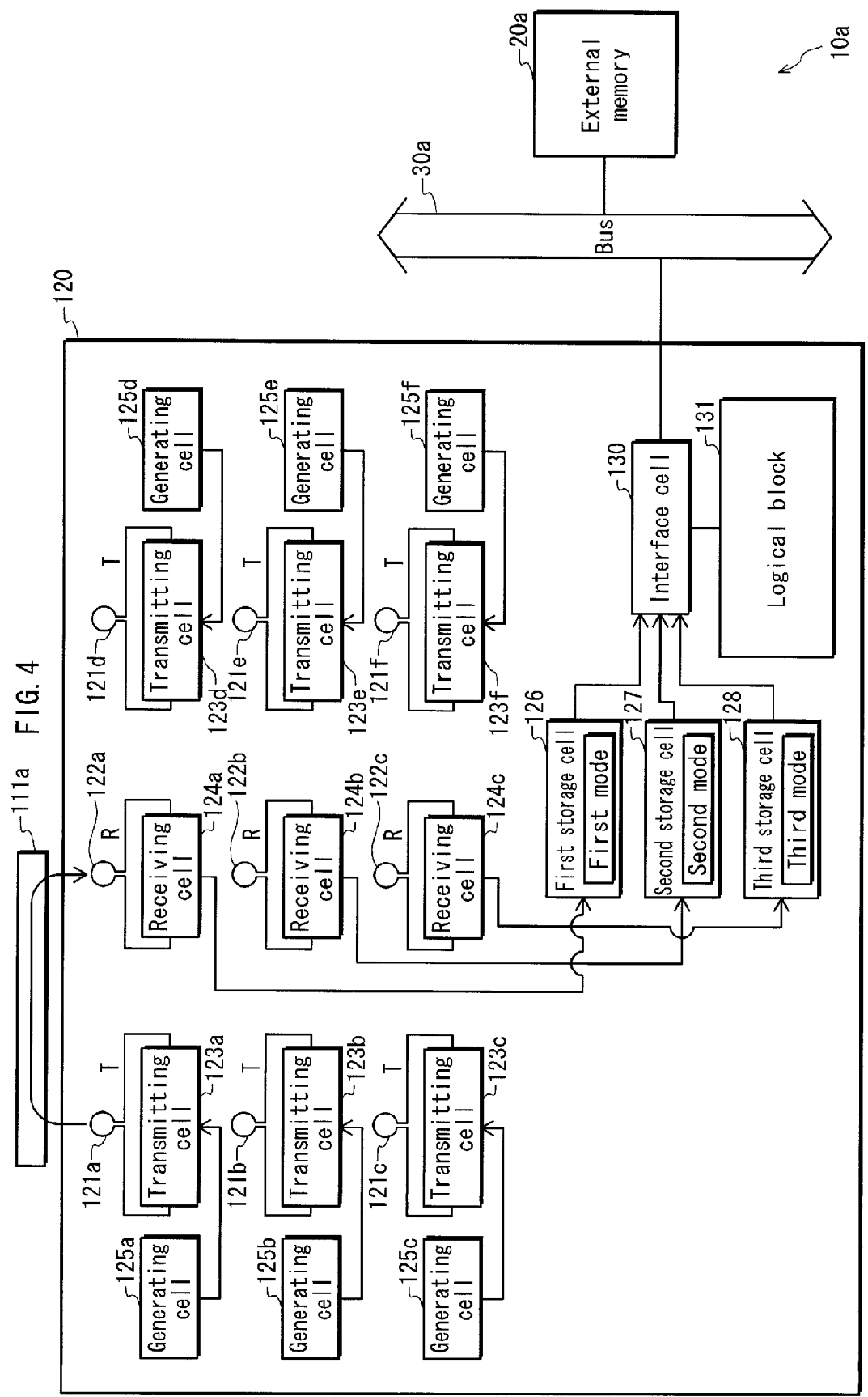

As shown in FIG. 4, the semiconductor chip 120 is composed of the transmitting antennas 121a, 121b, 121c, 121d, 121e and 121f, transmitting cells 123a, 123b, 123c, 123d, 123e and 123f, generating cells 125a, 125b, 125c, 125d, 125e and 125f, the receiving antennas 122a, 122b and 122c, receiving cells 124a, 124b and 124c, a first storage cell 126, a second storage cell 127, a third storage cell 128, an interface cell 130 and a logical block 131. These are formed inside the semiconductor chip 120 with use of a process technology of a semiconductor.

(1) Transmitting Antenna and Receiving Antenna

The transmitting antenna 121a is a coil-like (inductor-like) metal wire, wound more than once. The transmitting antenna 121a is provided inside the semiconductor chip 120 with use of the process technology of a semiconductor. The transmitting antenna 121a is formed so that a magnetic field is perpendicular to the upper surface of the semiconductor chip 120. In addition, as shown in FIG. 3, the transmitting antenna 121a is positioned inside the semiconductor chip 120 close to the upper surface thereof so that the upper part of the coil is exposed outside of the upper surface of the semiconductor chip 120. The transmitting antennas 121b, 121c, 121d, 121e and 121f and the receiving antennas 122a, 122b and 122c are formed in the same manner as the transmitting antenna 121a.

Each transmitting antenna is inductively coupled with a receiving antenna via a conductor provided on the propagation plate 101a, thereby transmitting and receiving data with the receiving antenna.

In addition, as shown in FIG. 2, the transmitting antennas 121a, 121b, 121c, 121d, 121e and 121f and the receiving antennas 122a, 122b and 122c are provided in a matrix inside the semiconductor chip 120. In the first row of the matrix, the transmitting antennas 121a, 121b and 121c are provided in the stated order. In the second row of the matrix, the receiving antennas 122a, 122b and 122c are provided in the stated order. In the third row of the matrix, the transmitting antennas 121d, 121e and 121f are provided in the stated order.

(2) Generating Cells 125a, 125b, 125c, 125d, 125e and 125f

The generating cell 125a generates transmission data. The transmission data indicates either high level (H) or low level (L). The generating cell 125a outputs the generated transmission data to the transmitting cell 123a only once after the semiconductor device 100a is reset. That is, the generating cell 125a outputs the transmission data only once at the time of system bootup. In addition, the generating cell 125a receives a clock signal from an unillustrated clock signal generating cell, and outputs the received clock signal to the transmitting cell 123a as a transmission clock signal.

Since the generating cells 125b, 125c, 125d, 125e and 125f each have the same structure as that of the generating cell 125a, explanations thereof are omitted. Note that each of the generating cells 125b, 125c, 125d, 125e and 125f outputs generated transmission data and a transmission clock signal to a corresponding one of transmitting cells 123b, 123c, 123d, 123e and 123f.

In addition, which of H and L is indicated by the generated transmission data has been determined for each of the generating cells 125a, 125b, 125c, 125d, 125e and 125f.

Note that the generating cell 125a may output transmission data more than once after the semiconductor device 100a is reset.

In addition, the generating cell 125a may output the transmission data at another timing during operation of the semiconductor device 100a instead of not after the semiconductor device 100a is reset, in accordance with an instruction from another circuit provided to the semiconductor chip 120. In this way, an operation mode can be changed during operation of the semiconductor device 100a. In addition, at another timing, the transmission data may be output in accordance with an instruction from another circuit provided to the semiconductor chip 120 during operation of the semiconductor device 100a. In this way, an operation mode can be further changed after the operation mode has been changed.

(3) Transmitting Cells 123a, 123b, 123c, 123d, 123e and 123f

When data is transmitted via wireless communication, it is difficult to constantly maintain the data indicating H. Accordingly, the transmitting cell 123a outputs an electrical signal changing in accordance with the first pattern as a signal indicating H, and the transmitting cell 123a outputs an electrical signal changing in accordance with the second pattern as a signal indicating L. The first pattern and the second pattern are described later.

The transmitting cell 123a receives the transmission data and the transmission clock signal from the generating cell 125a. The transmitting cell 123a generates an electrical signal synchronizing with the received transmission clock signal and changing in accordance with the received transmission data.

When the transmission data indicates H, an electrical signal is generated so as to linearly change from the first potential (for example, 0 v) to the second potential (for example, 5 v) and further linearly change from the second potential to the first potential, as one example (the first pattern). The transmission data indicates the second potential. A time period required to change from the first potential to the second potential is fixed, and a time period required to change from the second potential to the first potential is also fixed. Such a time period is each 100 ms, for example. In this way, the first pattern is a triangle wave. The starting point of the change of the electrical signal is determined in synchronization with the transmission clock signal.

When the transmission data indicates L, an electrical signal is generated so as to linearly change from the first potential (for example, 0 v) to the third potential (for example, −5 v) and further linearly change from the third potential to the first potential, as one example (the second pattern). The transmission data indicates the third potential. A time period required to change from the first potential to the third potential is fixed, and a time period required to change from the third potential to the first potential is also fixed. Such a time period is each 100 ms, for example. In this way, the second pattern is a triangle wave. The starting point of the change of the electrical signal is determined in synchronization with the transmission clock signal.

Next, the transmitting cell 123a outputs the generated electrical signal to the transmitting antenna 121a.

Since the transmitting cells 123b, 123c, 123d, 123e and 123f each have the same structure as that of the transmitting cell 123a, explanations thereof are omitted. Note that the transmitting cells 123b, 123c, 123d, 123e and 123f each receive transmission data and a transmission clock signal from a corresponding one of the generating cells 125b, 125c, 125d, 125e and 125f.

Note that Patent Literature 2 describes an example of each transmitting cell and electrical signals that change in accordance with the first pattern and the second pattern.

(4) Receiving Cells 124a, 124b and 124c

The receiving cell 124a consider the received electrical signal changing in accordance with the third pattern as indicating H, and considers the received electrical signal changing in accordance with the fourth pattern as indicating L. Here, when the transmitting cell 123a outputs, to the transmitting antenna 121a, the electrical signal changing in accordance with the first pattern, the receiving cell 124a receives an electrical signal changing in accordance with the third pattern from the receiving antenna 122a that is inductively coupled with the transmitting antenna 121a. Alternatively, when the transmitting cell 123a outputs, to the transmitting antenna 121a, the electrical signal changing in accordance with the second pattern, the receiving cell 124a receives an electrical signal changing in accordance with the fourth pattern from the receiving antenna 122a that is inductively coupled with the transmitting antenna 121a.

The receiving cell 124a receives an electrical signal from the receiving antenna 122a, and judges whether or not the received electrical signal changes. The receiving cell 124a further judges in accordance with which of the third pattern and the fourth pattern the received electrical signal changes. In the case where the received electrical signal changes in accordance with the third pattern, the receiving cell 124a considers the received electrical signal as indicating H, and outputs a value indicating H to the first storage cell 126 as a first mode value indicating the first mode. In the case where the received electrical signal changes in accordance with the fourth pattern, the receiving cell considers the received electrical signal as indicating L, and outputs a value indicating L to the first storage cell 126 as the first mode value.

The receiving cells 124b and 124c includes the same structure as that of the receiving cell 124a.

When the receiving cell 124b considers the received electrical signal as indicating H, the receiving cell 124b outputs a value indicating H to the second storage cell 127 as a second mode value indicating the second mode. When the receiving cell 124b considers the received electrical signal as indicating L, the receiving cell 124b outputs a value indicating L to the second storage cell 127 as the second mode value.

When the receiving cell 124c considers the received electrical signal as indicating H, the receiving cell 124c outputs a value indicating H to the third storage cell 128 as a third mode value indicating the third mode. When the receiving cell 124c considers the received electrical signal as indicating L, the receiving cell 124c outputs a value indicating L to the third storage cell 128 as the third mode value.

Note that Patent Literature 2 describes an example of each receiving cell and electrical signals that change in accordance with the third pattern and the fourth pattern.

(5) First Storage Cell 126, Second Storage Cell 127 and Third Storage Cell 128

The first storage cell 126 includes an area for storing the first mode value for setting the first mode. The first mode value indicates H, L or high impedance (Hi-Z).

The second storage cell 127 includes an area for storing the second mode value for setting the second mode. The second mode value indicates H, L or Hi-Z.

The third storage cell 128 includes an area for storing the third mode value for setting the third mode. The third mode value indicates H, L or Hi-Z.

(6) Interface Cell 130

The interface cell 130 controls input/output of data between an external bus 30a and the logical block 131. In addition, the interface cell 130 switches between operation modes in accordance with the first mode value, the second mode value and the third mode value that are stored in the first storage cell 126, the second storage cell 127 and the third storage cell 128, respectively. That is, the interface cell 130 is a switching circuit that switches between the operation modes in accordance with the changing electrical signal that has been detected by any one of the receiving cells.

(7) Logical Block 131

The logical block 131 is a micro processing unit (MPU), a digital signal processor (DSP), a memory controller, or a combination thereof, for example. In addition, the logical block 131 performs input/output of data to/from other electronic components mounted on the circuit substrate 10a such as an external memory 20a via the interface cell 130.

1.2 Inductive Coupling Between Transmitting Antenna and Receiving Antenna and Settings of Each Mode (1) Example of Propagation Plate 101a

Figure 5:
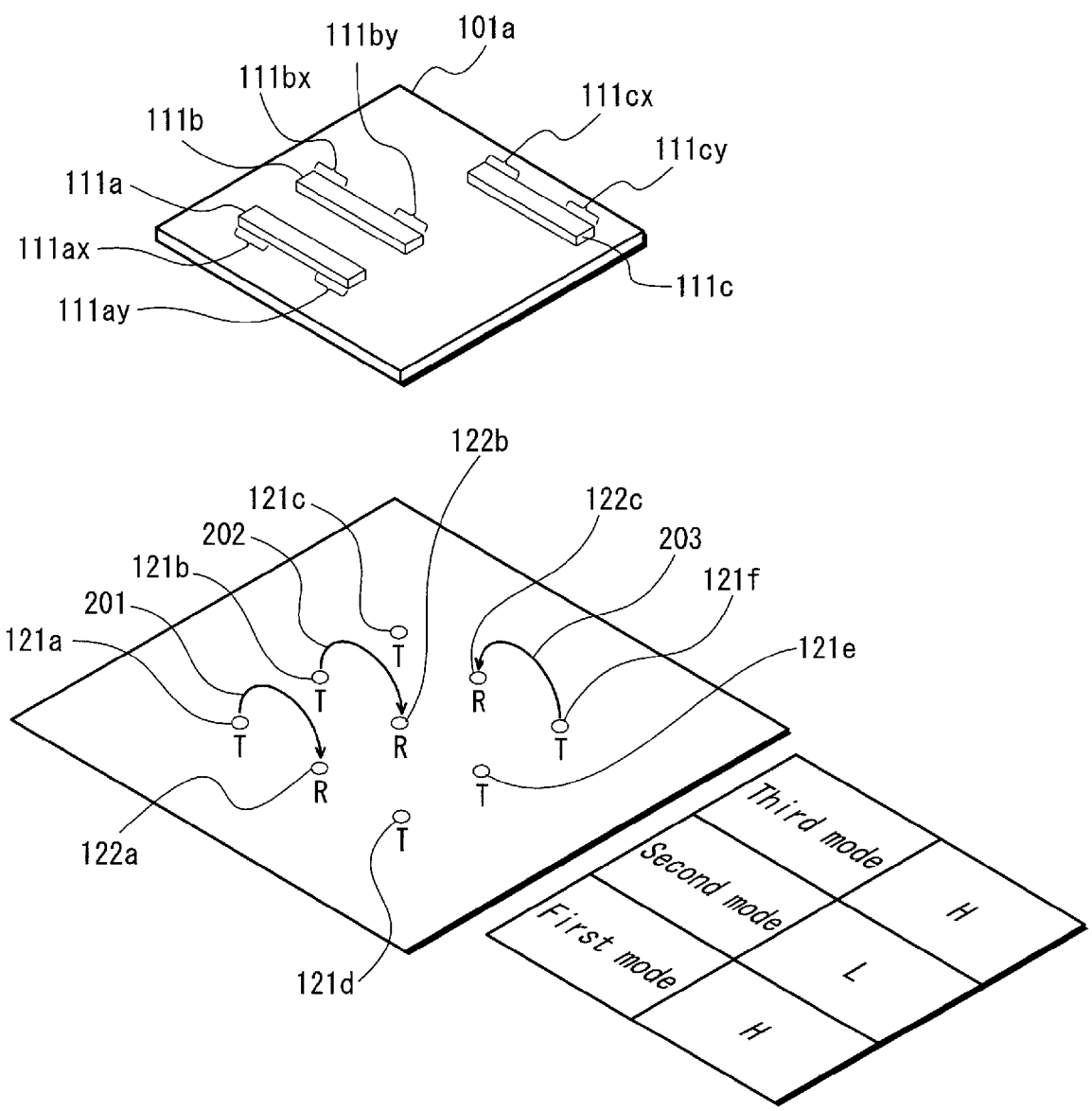
FIG. 5 shows relation between the positions of conductors 111a, 111b and 111c on a propagation plate 101a and connection paths of transmitting antennas and receiving antennas of the semiconductor chip 120.

FIG. 5 shows relation among the positions of conductors 111a, 111b and 111c on the propagation plate 101a, inductive coupling between the transmitting antennas and receiving antennas of the semiconductor chip 120, and the first mode, the second mode and the third mode that are stored in the first storage cell 126, the second storage cell 127 and the third storage cell 128, respectively.

When the transmitting cell 123a outputs, to the transmitting antenna 121a, an electrical signal at potential that changes in accordance with the first pattern, the transmitting antenna 121a and the receiving antenna 122a are coupled with each other by electromagnetic induction via the conductor 111a. Accordingly, the receiving cell 124a receives, from the receiving antenna 122a, an electrical signal that changes in accordance with the third pattern. The electrical signal received by the receiving cell 124a is at a potential that changes. When the receiving cell 124a detects an electrical signal at the potential that changes in accordance with the third pattern, the receiving cell 124a outputs a value indicating H to the first storage cell 126 as the first mode value. The first storage cell 126 stores therein the value indicating H as the first mode value. FIG. 5 shows a path 201 through which a signal passes in this case. FIG. 5 also shows the first mode in this case.

Furthermore, when the transmitting cell 123a outputs, to the transmitting antenna 121a, an electrical signal at a potential that changes in accordance with the second pattern, the transmitting antenna 121a and the receiving antenna 122a are inductively coupled with each other via the conductor 111a. Accordingly, the receiving cell 124a receives, from the receiving antenna 122a, an electrical signal that changes in accordance with the fourth pattern. The electrical signal received by the receiving cell 124a is at a potential that changes. When the receiving cell 124a detects an electrical signal at a potential that changes in accordance with the fourth pattern, the receiving cell 124a outputs a value indicating L to the first storage cell 126 as the first mode value. The first storage cell 126 stores therein the value indicating L as the first mode value.

On the other hand, when the transmitting cell 123a outputs, to the transmitting antenna 121a, an electrical signal at a potential that does not change, or when the transmitting cell 123a does not output an electrical signal to the transmitting antenna 121a, the transmitting antenna 121a and the receiving antenna 122a are not inductively coupled with each other via the conductor 111a. Accordingly, the receiving cell 124a does not receive an electrical signal from the receiving antenna 122a. When the receiving cell 124a does not receive an electrical signal, the receiving cell 124a outputs a value indicating Hi-Z to the first storage cell 126 as the first mode value. The first storage cell 126 stores therein the value indicating Hi-Z as the first mode value.

In addition, in the same manner as above, there are two cases: a case in which the transmitting antenna 121b and the receiving antenna 122b are inductively coupled with each other; and a case in which the transmitting antenna 121b and the receiving antenna 122b are not inductively coupled with each other. Accordingly, the second storage cell 127 stores therein a value indicating H, L or Hi-Z as the second mode value. FIG. 5 shows a path 202 through which a signal passes when the transmitting antenna 121b and the receiving antenna 122b are inductively coupled with each other. FIG. 5 also shows a case in which the second storage cell 127 stores therein a value indicating L as the second mode value.

Furthermore, in the same manner as above, there are two cases: a case in which the transmitting antenna 121f and the receiving antenna 122c are inductively coupled with each other; and a case in which the transmitting antenna 121f and the receiving antenna 122c are not inductively coupled with each other. Accordingly, the third storage cell 128 stores a therein value indicating H, L or Hi-Z as the third mode value. FIG. 5 shows a path 203 through which a signal passes when the transmitting antenna 121f and the receiving antenna 122c are inductively coupled with each other. FIG. 5 also shows the third mode in this case.

However, since any conductor is not provided above the transmitting antennas 121c, 121d and 121e on the propagation plate 101a, the transmitting antennas 121c, 121d and 121e are not inductively coupled with any receiving antenna.

Accordingly, any receiving antenna does not receive an electrical signal from the transmitting antennas 121c, 121d and 121e.

(2) Example of Propagation Plate 101b

FIG. 6 shows relation among the positions of the conductors 111d and 111e on the propagation plate 101b, inductive coupling between the transmitting antennas and receiving antennas of the semiconductor chip 120, and the first mode, the second mode and the third mode that are stored in the first storage cell 126, the second storage cell 127 and the third storage cell 128, respectively.

When the transmitting cell 123a outputs, to the transmitting antenna 121a, an electrical signal at a potential that changes in accordance with the first pattern, the transmitting antenna 121a and the receiving antenna 122b are inductively coupled with each other via the conductor 111d, and the transmitting antenna 121a and the receiving antenna 122c are inductively coupled with each other via the conductor 111d. Accordingly, the receiving cell 124b receives, from the receiving antenna 122b, an electrical signal at a potential that changes in accordance with the third pattern, and the receiving cell 124c receives, from the receiving antenna 122c, an electrical signal at a potential that changes in accordance with the third pattern. The electrical signal received by the receiving cell 124b is at a potential that changes. When the receiving cell 124b detects an electrical signal at a potential that changes in accordance with the third pattern, the receiving cell 124b outputs a value indicating H to the second storage cell 127 as the second mode value. The second storage cell 127 stores therein the value indicating H as the second mode value. FIG. 6 shows a path 204 through which a signal passes in this case. FIG. 6 also shows the second mode in this case. In addition, the electrical signal received by the receiving cell 124c is at a potential that changes. When the receiving cell 124c detects an electrical signal at a potential that changes in accordance with the third pattern, the receiving cell 124c outputs a value indicating H to the third storage cell 128 as the third mode value. The third storage cell 128 stores therein the value indicating H as the third mode value. FIG. 6 shows a path 205 through which a signal passes in this case. FIG. 6 also shows the third mode in this case.

When the transmitting cell 123a outputs, to the transmitting antenna 121a, an electrical signal at a potential that changes in accordance with the second pattern, the transmitting antenna 121a and the receiving antenna 122b are inductively coupled with each other via the conductor 111d, and the transmitting antenna 121a and the receiving antenna 122c are inductively coupled with each other via the conductor 111d. Accordingly, the receiving cell 124b receives, from the receiving antenna 122b, an electrical signal at a potential that changes in accordance with the fourth pattern, and the receiving cell 124c receives, from the receiving antenna 122c, an electrical signal at a potential that changes in accordance with the fourth pattern. The electrical signal received by the receiving cell 124b has a potential that changes. When the receiving cell 124b detects an electrical signal at a potential that changes in accordance with the fourth pattern, the receiving cell 124b outputs a value indicating L to the second storage cell 127 as the second mode value. The second storage cell 127 stores therein the value indicating L as the second mode value. Also, the electrical signal received by the receiving cell 124c is at a potential that changes. When the receiving cell 124c detects an electrical signal at a potential that changes in accordance with the fourth pattern, the receiving cell 124c outputs a value indicating L to the third storage cell 128 as the third mode value. The third storage cell 128 stores therein the value indicating L as the third mode value.

On the other hand, when the transmitting cell 123a outputs, to the transmitting antenna 121a, an electrical signal at a potential that does not change, or when the transmitting cell 123a does not output an electrical signal to the transmitting antenna 121a, the transmitting antenna 121a and the receiving antenna 122b are not inductively coupled with each other via the conductor 111d, and the transmitting antenna 121a and the receiving antenna 122c are not inductively coupled with each other via the conductor 111d. Accordingly, the receiving cell 124b does not receive an electrical signal from the receiving antenna 122b. When the receiving cell 124b does not receive an electrical signal, the receiving cell outputs a value indicating Hi-Z to the second storage cell 127 as the second mode value. The second storage cell 127 stores therein the value indicating Hi-Z as the second mode value. Also, the receiving cell 124c does not receive an electrical signal from the receiving antenna 122c. When the receiving cell 124c does not receive an electrical signal, the receiving cell outputs a value indicating Hi-Z to the third storage cell 128 as the third mode value. The third storage cell 128 stores therein the value indicating Hi-Z as the third mode value.

In addition, in the same manner as above, there are two cases: a case in which the transmitting antenna 121f and the receiving antenna 122a are inductively coupled with each other; and a case in which the transmitting antenna 121f and the receiving antenna 122a are not inductively coupled with each other. Accordingly, the first storage cell 126 stores therein a value indicating H, L or Hi-Z as the first mode value. FIG. 6 shows a path 206 through which a signal passes when the transmitting antenna 121f and the receiving antenna 122a are inductively coupled with each other. FIG. 6 also shows the first mode when the transmitting antenna 121f and the receiving antenna 122a are inductively coupled with each other.

However, since any conductor is not provided above the transmitting antennas 121b, 121c, 121d and 121e on the propagation plate 101b, the transmitting antennas 121b, 121c, 121d and 121e are not inductively coupled with any receiving antenna. Accordingly, any receiving antenna does not receive an electrical signal from the transmitting antennas 121b, 121c, 121d and 121e.

(3) Example of Propagation Plate 101c

FIG. 7 shows relation among the positions of the conductors 111f and 111g on the propagation plate 101c, inductive coupling between the transmitting antennas and receiving antennas of the semiconductor chip 120, and the first mode, the second mode and the third mode that are stored in the first storage cell 126, the second storage cell 127 and the third storage cell 128, respectively.

When the transmitting cell 123b outputs, to the transmitting antenna 121b, an electrical signal at a potential that changes in accordance with the first pattern, the transmitting antenna 121b and the receiving antenna 122a are inductively coupled with each other via the conductor 111f. Accordingly, the receiving cell 124a receives, from the receiving antenna 122a, an electrical signal that changes in accordance with the third pattern. The electrical signal received by the receiving cell 124a is at a potential that changes. When the receiving cell 124a detects an electrical signal at a potential that changes in accordance with the third pattern, the receiving cell 124a outputs a value indicating H to the first storage cell 126 as the first mode value. The first storage cell 126 stores therein the value indicating H as the first mode value.

Also, when the transmitting cell 123b outputs, to the transmitting antenna 121b, an electrical signal at a potential that changes in accordance with the second pattern, the transmitting antenna 121b and the receiving antenna 122a are inductively coupled with each other via the conductor 111f.

Accordingly, the receiving cell 124a receives, from the receiving antenna 122a, an electrical signal that changes in accordance with the fourth pattern. The electrical signal received by the receiving cell 124a is at a potential that changes. When the receiving cell 124a detects an electrical signal at a potential that changes in accordance with the fourth pattern, the receiving cell 124a outputs a value indicating L to the first storage cell 126 as the first mode value. The first storage cell 126 stores therein the value indicating L as the first mode value. FIG. 7 shows a path 207 through which a signal passes in this case.

On the other hand, when the transmitting cell 123b outputs, to the transmitting antenna 121b, an electrical signal at a potential that does not change, or when the transmitting cell 123b does not output an electrical signal to the transmitting antenna 121b, the transmitting antenna 121b and the receiving antenna 122a are not inductively coupled with each other via the conductor 111f. Therefore, the receiving cell 124a does not receive an electrical signal from the receiving antenna 122a. When the receiving cell 124a does not receive an electrical signal, the receiving cell 124a outputs a value indicating Hi-Z to the first storage cell 126 as the first mode value. The first storage cell 126 stores therein the value indicating Hi-Z as the first mode value.

In addition, in the same manner as above, there are two cases: a case in which the transmitting antenna 121f and the receiving antenna 122b are inductively coupled with each other; and a case in which the transmitting antenna 121f and the receiving antenna 122b are not inductively coupled with each other. The second storage cell 127 stores therein a value indicating H, L or Hi-Z as the second mode value. FIG. 7 shows a path 208 through which a signal passes when the transmitting antenna 121f and the receiving antenna 122b are inductively coupled with each other. FIG. 7 also shows the second mode when the transmitting antenna 121f and the receiving antenna 122b are inductively coupled with each other.

However, since any conductor is not provided above the transmitting antennas 121a, 121c, 121d and 121e on the propagation plate 101c, the transmitting antennas 121a, 121c, 121d and 121e are not inductively coupled with any receiving antenna. Accordingly, any receiving antenna does not receive an electrical signal from the transmitting antennas 121a, 121c, 121d and 121e.

The receiving antenna 122c is not inductively coupled with any transmitting antenna, and is in a state of Hi-Z. In this case, as shown in FIG. 7, the third mode has a value indicating Hi-Z.

1.3 Examples of Application of Semiconductor Device

The following describes examples of applications of semiconductor devices to which the propagation plates described above adhere.

Figure 8:
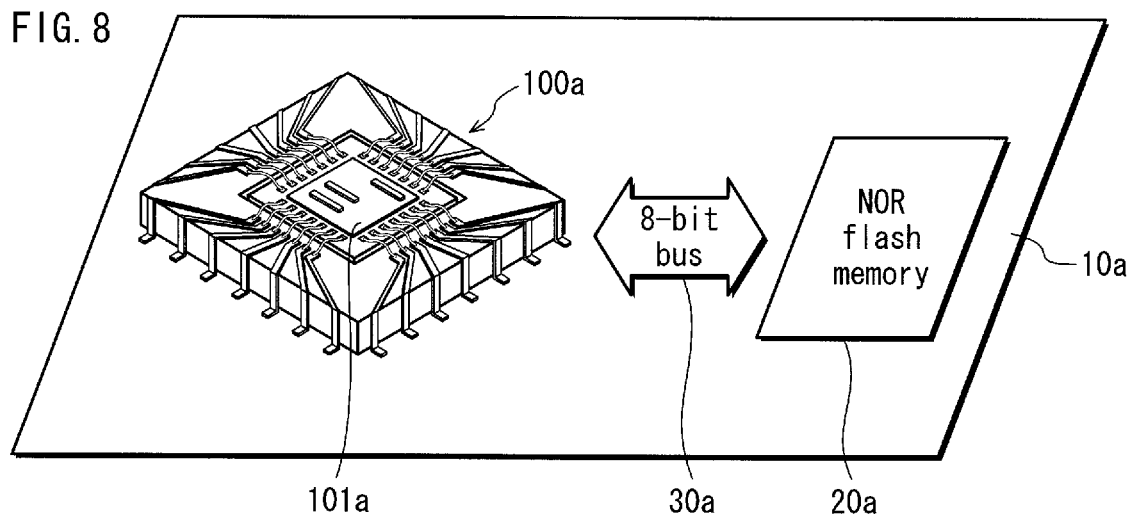
Figure 9:
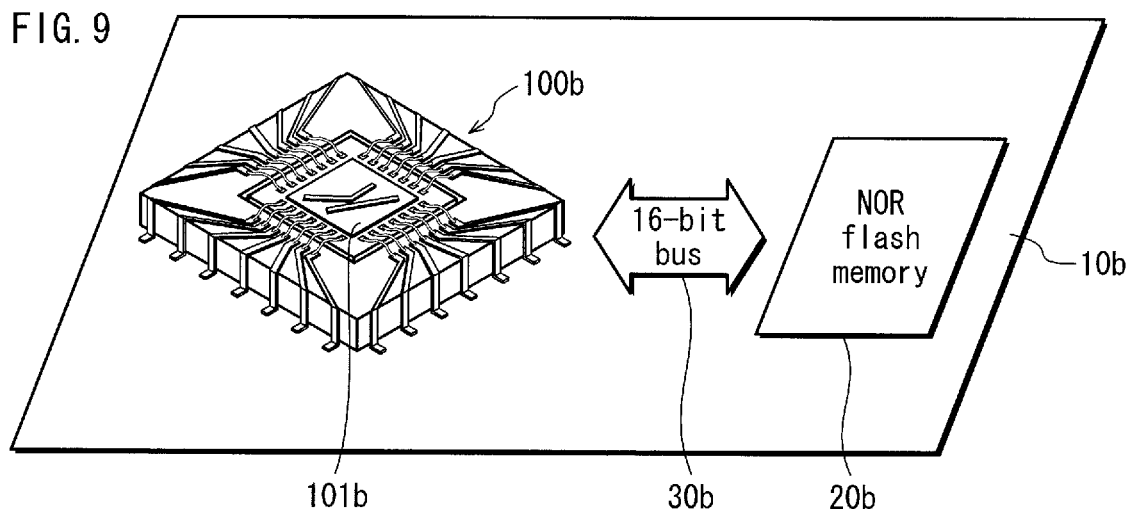
FIG. 9 shows relation between the positions of conductors on the propagation plate 101b and another device mounted on a circuit substrate 10b.
Figure 10:
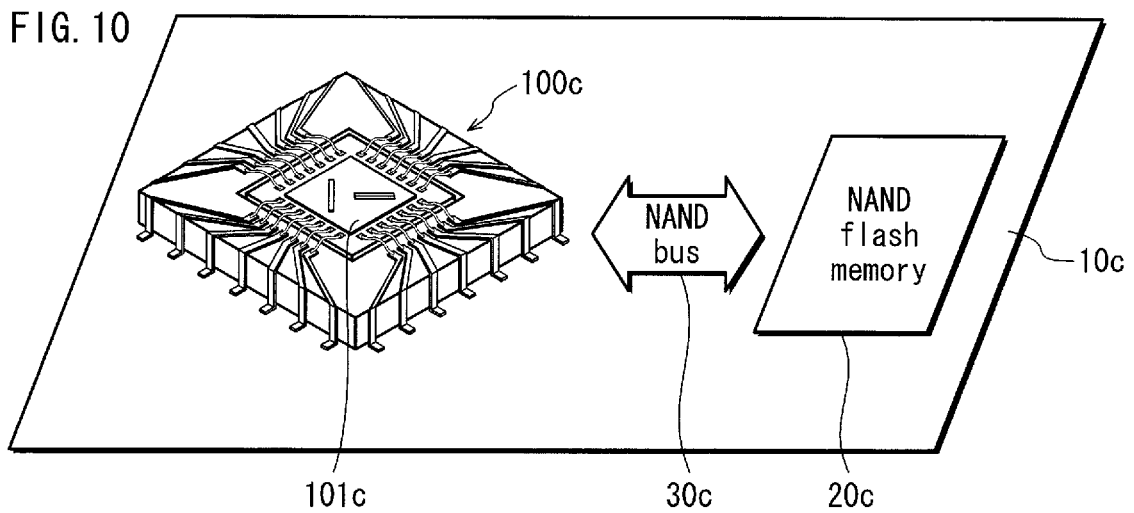
FIG. 10 shows relation between the positions of conductors on the propagation plate 101c and another device mounted on a circuit substrate 10c.

FIGS. 8, 9, and 10 respectively show the circuit substrate 10a including the semiconductor device 100a to which the propagation plate 101a adheres, a circuit substrate 10b including a semiconductor device 100b to which the propagation plate 101b adheres, and a circuit substrate 10c including a semiconductor device 100c to which the propagation plate 101c adheres.

On the circuit substrate 10a, the semiconductor device 100a, an 8-bit width bus 30a, and a NOR flash memory 20a are mounted. On the circuit substrate 10b, the semiconductor device 100b, a 16-bit width bus 30b, and a NOR flash memory 20b are mounted. On the circuit substrate 10c, the semiconductor device 100c, a NAND bus 30c, and a NAND flash memory 20c are mounted. Note that though other electronic components are mounted on each circuit substrate, these electronic components are omitted.

Here, in the semiconductor chip 120, the first mode, the second mode, and the third mode that are respectively received by the receiving antennas 122a, 122b, and 122c and stored in the first storage cell 126, the second storage cell 127, and the third storage cell 128 are for determining a memory or a bus on the circuit substrates 10a, 10b and 10c described above.

The first mode is for determining the type of a memory. When a value of the first mode indicates H, the semiconductor chip 120 judges that a NOR flash memory is connected, and performs an operation accordingly. When a value of the first mode indicates L, the semiconductor chip 120 judges that a NAND flash memory is connected, and performs an operation accordingly.

The second mode is for determining a bus. When a value of the second mode indicates H, the semiconductor chip 120 judges that a 16-bit width bus is connected, and performs an operation accordingly. When a value of the second mode indicates L, the semiconductor chip 120 judges that an 8-bit width bus is connected, and performs an operation accordingly.

The third mode is for determining an operation mode when a NOR flash memory is used. When a value of the third mode indicates H, the semiconductor chip 120 operates in a fixed wait mode. When a value of the third mode indicates L, the semiconductor chip 120 operates in a hand-shake mode using an acknowledge signal. In addition, when a NAND flash memory is used, the semiconductor chip 120 does not refer to the third mode.

The transmitting cell 123f of the semiconductor chip 120 always outputs a value indicating H. The transmitting cell 123b of the semiconductor chip 120 always outputs a value indicating L. The transmitting cell 123a of the semiconductor chip 120 always outputs a value indicating H.

Accordingly, H is set to the third mode of the semiconductor device 100a, L is set to the second mode of the semiconductor device 100a, and H is set to the first mode of the semiconductor device 100a.

Also, H is set to the third mode of the semiconductor device 100b, H is set to the second mode of the semiconductor device 100b, and H is set to the first mode of the semiconductor device 100b.

Furthermore, Hi-Z is set to the third mode of the semiconductor device 100c, H is set to the second mode of the semiconductor device 100c, and L is set to the first mode of the semiconductor device 100c.

As described above, according to the semiconductor device 100a shown in FIG. 8, H is set to the third mode, L is set to the second mode, and H is set to the first mode. Accordingly, on the circuit substrate 10a, the type of the memory is a NOR flash memory (first mode=H), a bus width is 8-bit (second mode=L), and the NOR flash memory is accessed in the fixed wait mode (third mode=H).

In addition, according to the semiconductor device 100b shown in FIG. 9, H is set to the third mode, H is set to the second mode, and H is set to the first mode. Accordingly, on the circuit substrate 10b, the type of the memory is a NOR flash memory (first mode=H), a bus width is 16-bit (second mode=H), and the NOR flash memory is accessed in the fixed wait mode (third mode=H).

In addition, according to the semiconductor device 100c shown in FIG. 10, H is set to the second mode, and L is set to the first mode. Accordingly, on the circuit substrate 10c, the type of the memory is a NAND flash memory (first mode=L), and a bus width is 16-bit (second mode=H).

As described above, according to the present embodiment, it is possible to configure a semiconductor device that can change the setting with use of close proximity wireless communication without using an external dedicated terminal or an external shared terminal.

2. Embodiment 2

A semiconductor device 100d of another embodiment of the present invention is described below.

The semiconductor device 100d includes a structure similar to that of the semiconductor device 100a. The semiconductor device 100d differs from the semiconductor device 100a in that conductors are provided so as to be close to transmitting antennas and receiving antennas that are provided on the lower surface of the semiconductor device 100d, as described below in detail. Aside from this point, the semiconductor device 100d is identical to the semiconductor device 100a.

Figure 11:
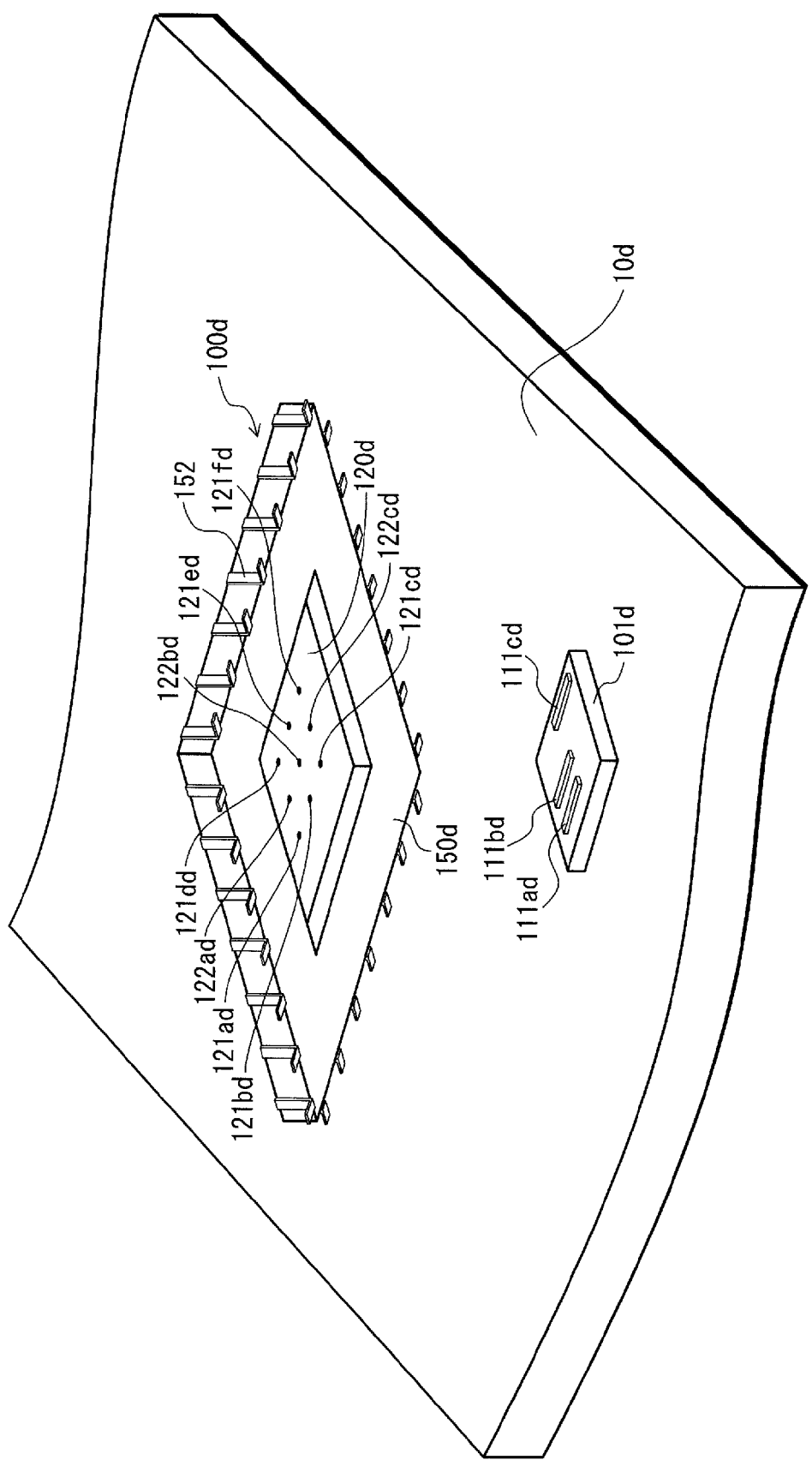
FIG. 11 is an exploded view showing a semiconductor device 100d pertaining to Embodiment 2.
Figure 12:
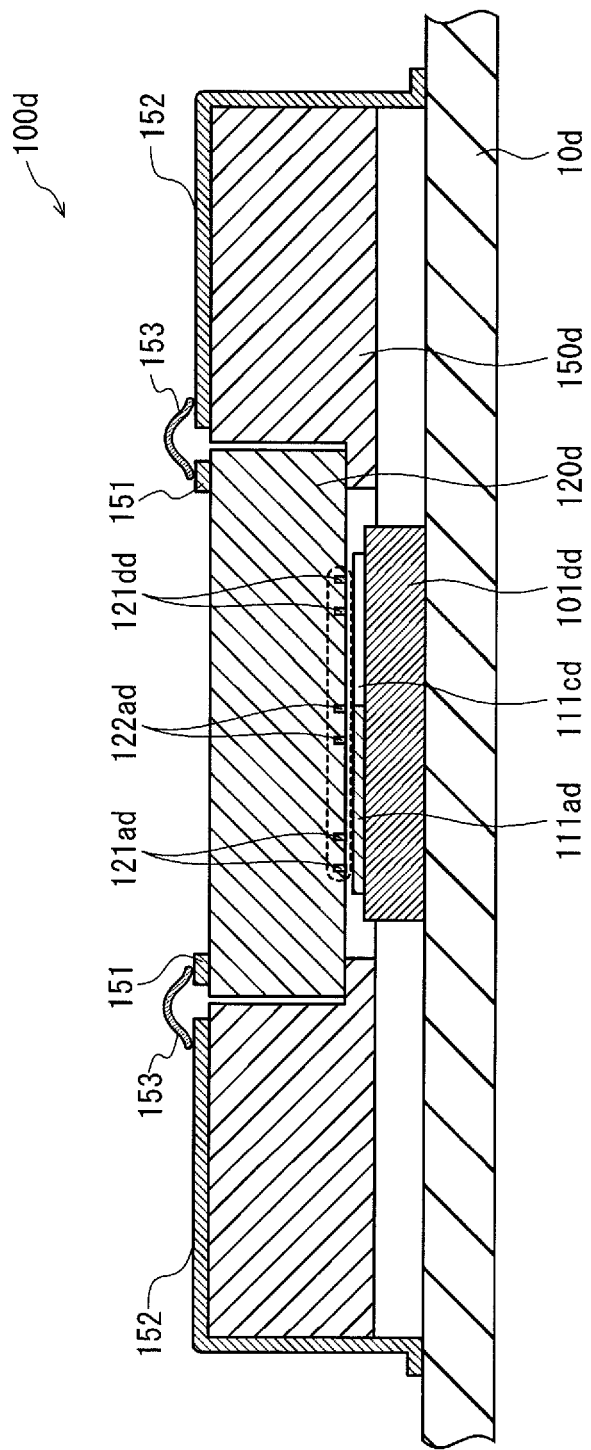
FIG. 12 is a cross-sectional view of the semiconductor device 100d.

As shown in FIGS. 11 and 12, the semiconductor device 100d is mounted on a circuit substrate 10d along with unillustrated other electronic components, and is composed of a propagation plate 101d, a semiconductor chip 120d, and a package 150d. The propagation plate 101d is mounted on the circuit substrate 10d. The package 150d surrounds the semiconductor chip 120d to provide protection.

Transmitting antennas 121ad, 121bd and 121cd, receiving antennas 122ad, 122bd and 122cd, and transmitting antennas 121dd, 121ed, and 121fd are provided in a matrix inside the semiconductor chip 120d so that the upper part of each antenna is exposed outside of the lower surface of the semiconductor chip 120d.

As shown in FIGS. 11 and 12, the propagation plate 101d is made of an insulator and adheres to the upper surface of the circuit substrate 10d, and conductors 111ad, 111bd and 111cd adhere to the upper surface of the propagation plate 101d with an acrylic adhesive and the like. The conductors 111ad, 111bd and 111cd are made of Cu, for example, and are band-like conductive foils like the conductors 111a, 111b and 111c.

When the propagation plate 101d adheres to the upper surface of the circuit substrate 10d and the semiconductor chip 120d surrounded by the package 150d to be protected is provided on the propagation plate 101d, the conductors 111ad, 111bd and 111cd have adhered to the upper surface of the propagation plate 101d so that one end of the conductor 111ad is close to the transmitting antenna 121ad, the other end of the conductor 111ad is close to the receiving antenna 122ad, one end of the conductor 111bd is close to the transmitting antenna 121bd, the other end of the conductor 111bd is close to the receiving antenna 122bd, one end of the conductor 111cd is close to the receiving antenna 122cd, and the other end of the conductor 111cd is close to the transmitting antenna 121fd.

The distance between the upper surface of each conductor and the lower surface of the semiconductor chip 120d is equal to or less than 1 mm.

As described above, according to the semiconductor device 100a of Embodiment 1, the propagation plate 101a adheres to the upper surface of the semiconductor chip 120, and according to the semiconductor device 100d of Embodiment 2, the propagation plate 101d is provided on the circuit substrate 10d.

3. Modifications

While the present invention has been described based on the above Embodiments, the present invention is of course not limited to these Embodiments. The present invention also includes cases such as the following.

Figure 13:
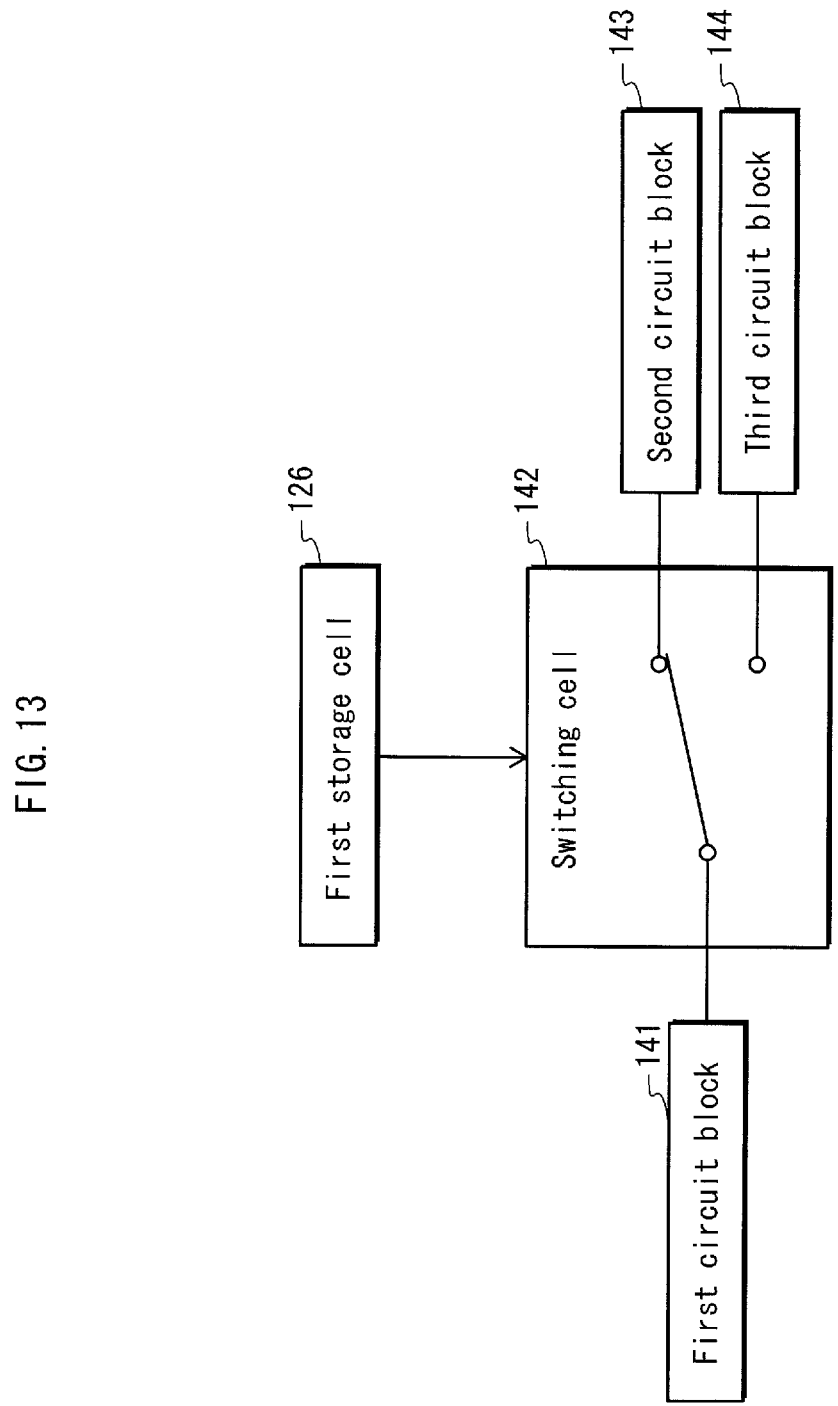
FIG. 13 is a block diagram showing a structure of a semiconductor chip of the semiconductor device as a modification.

(1) As shown in FIG. 13, the semiconductor chip 120 may further include a first circuit block 141, a switching cell 142, a second circuit block 143, and a third circuit block 144. In addition, the semiconductor chip 120 may include the first circuit block 141, the switching cell 142, the second circuit block 143, and the third circuit block 144 that are shown in FIG. 13 instead of the logical block 131. Alternatively, the semiconductor chip 120 may include the first circuit block 141, the switching cell 142, the second circuit block 143, and the third circuit block 144 that are shown in FIG. 13 inside the logical block 131.

The switching cell 142 reads the first mode from the first storage cell 126. When the read first mode is H, the switching cell 142 connects the first circuit block 141 and the second circuit block 143, and disconnects the first circuit block 141 and the third circuit block 144. When the read first mode is L, the switching cell 142 disconnects the first circuit block 141 and the second circuit block 143, and connects the first circuit block 141 and the third circuit block 144.

(a) As the first example, the semiconductor chip 120 is mounted on a digital camera. The second circuit block 143 is a circuit that is used for normal operation and outputs a signal of a normal operation. For example, the second circuit block 143 is an image processing unit of the digital camera, and outputs an image signal generated according to photography by the digital camera. The third circuit block 144 is a circuit that is used for a test and outputs a signal for a test. For example, the third circuit block 144 outputs predetermined several patterns of image signals for the test. The first circuit block 141 is connected to the second circuit block 143 or the third circuit block 144, receives an image signal from the second circuit block 143 or the third circuit block 144, and generates compressed image data based on the received image signal. In this way, when the first mode is H, the semiconductor chip 120 operates as a circuit unit of a normal digital camera. When the first mode is L, the semiconductor chip 120 performs an operation for testing the first circuit block 141.

(b) As the second example, the semiconductor chip 120 is mounted on a content playback apparatus that plays back a content recorded on a recording medium. The recording medium records thereon an encrypted content using the first encryption method. The content playback apparatus decrypts the encrypted content and plays back the decrypted content. The first circuit block 141 reads the encrypted content from the recording medium. The second circuit block 143 decrypts the encrypted content using the first encryption method. The third circuit block 144 decrypts the encrypted content using the second encryption method. In the first place, H is set to the first storage cell 126, and the first circuit block 141 and the second circuit block 143 are connected to each other. Suppose that after the content playback apparatus is sold, encryption by the first encryption method is decrypted by an unauthorized individual. After that, a new recording medium records thereon an encrypted content using the second encryption method, and is sold. A new propagation plate adheres to the semiconductor chip 120, a new content playback apparatus is manufactured and sold, and a value indicating L is stored in the first storage cell 126. In this case, the first circuit block 141 and the third circuit block 144 are connected to each other. The encrypted content stored in the new recording medium is decrypted using the second encrypted method and played back.

(c) As the third example, the first circuit block 141 may be a field programmable gate array (FPGA), the second circuit block 143 may be a memory circuit, and the third circuit block 144 may also be a memory circuit. The second circuit block 143 may store therein configuration data for configuring the first processing circuit in the FPGA. The third circuit block 144 may store therein configuration data for configuring the second processing circuit in the FPGA. When the first storage cell 126 stores therein a value indicating H as the first mode value, the first circuit block 141, which is an FPGA, reads the configuration data from the second circuit block 143, which is a memory circuit, and configures the first processing circuit in the FPGA using the read configuration data. When the first storage cell 126 stores therein a value indicating L as the first mode value, the first circuit block 141, which is an FPGA, reads the configuration data from the third circuit block 144, which is a memory circuit, and configures the second processing circuit in the FPGA using the read configuration data.

(2) In each Embodiment described above, the logical block included in the semiconductor device is, as one example, an image processing circuit that processes images photographed by a digital camera. The semiconductor chip including each component shown in FIG. 4 may be a large-scale integration (LSI) circuit composed of one silicon device.

(3) As described above, the generating cell 125a generates transmission data indicating H or L. However, the generating cell 125a is not limited to this.

The generating cell 125a may generate only transmission data indicating H, and output the transmission data to the transmitting cell 123a. An initial value of the first mode stored in the first storage cell 126 is L. When the receiving cell 124a receives an electrical signal at a potential that changes in accordance with the third pattern, the receiving cell 124a outputs a value indicating H to the first storage cell 126 as the first mode value. The first storage cell 126 stores therein the value indicating H as the first mode value.

In addition, the generating cell 125a may generate more types of transmission data. For example, the generating cell 125a may generate four types of transmission data indicating −10 v, −5 v, 5 v and 10 v, for example. The transmitting cell 123a receives the transmission data from the generating cell 125a, and generates four types of electrical signals based on the received transmission data. These electrical signals are each a triangle wave as described above. Their respective summit potentials are −10 v, −5 v, 5 v, and 10 v. When receiving an electrical signal among the four types of electrical signals above, the receiving cell 124a identifies the received electrical signal, and outputs one of four pieces of mode information corresponding to the identified electrical signal to the first storage cell 126 as the first mode value. The first storage cell 126 stores therein the first mode indicating one of the four pieces of mode information. The interface cell 130 uses four different operations according to the first mode stored in the first storage cell 126.

(4) According to the above Embodiments, the semiconductor chip 120 includes six sets of a generating cell, a transmitting cell, and a transmitting antenna and three sets of a receiving cell and a receiving antenna. However, the semiconductor chip 120 is not limited to such a structure.

The semiconductor chip 120 may include less than six sets of a generating cell, a transmitting cell, and a transmitting antenna, and may include seven or more sets of a generating cell, transmitting cell, and a transmitting antenna.

In addition, the semiconductor chip 120 may include less than three sets of a receiving cell and a receiving antenna, and may include four or more sets of a receiving cell and a receiving antenna. Here, the number of modes increases or decreases in accordance with the number of sets of a receiving cell and a receiving antenna.

(5) According to the above Embodiments, the first storage cell 126, the second storage cell 127 and the third storage cell 128 respectively store therein the first mode, the second mode, and the third mode, but these structures are not limited to such structures.

The semiconductor chip 120 may include a mode storage instead of the first storage cell 126, the second storage cell 127, and the third storage cell 128. The mode storage may store therein the first mode, the second mode, and the third mode.

(6) According to the above Embodiments, the semiconductor chip 120 includes the generating cells 125a, 125b, 125c, 125d, 125e and 125f, but the semiconductor chip 120 is not limited to such a structure.

The semiconductor chip 120 may include only one generating cell instead of the generating cells 125a, 125b, 125c, 125d, 125e and 125f. The one generating cell may transmit the same transmission data and the same transmission clock signal to the transmitting cells 123a, 123b, 123c, 123d, 123e and 123f.

In addition, the semiconductor chip 120 may include only first and second generating cells instead of the generating cells 125a, 125b, 125c, 125d, 125e and 125f. The first generating cell may transmit the first transmission data and the first transmission clock signal to each of the transmitting cells 123a, 123b and 123c. The second generating cell may transmit the second transmission data and the second transmission clock signal to each of the transmitting cells 123d, 123e and 123f. Here, the first transmission data indicates H, and the second transmission data indicates L. On the contrary, the first transmission data may indicate L, and the second transmission data may indicate H.

Furthermore, the semiconductor chip 120 may include only one generating cell instead of the generating cells 125a, 125b, 125c, 125d, 125e and 125f. The one generating cell may transmit the same first transmission data and the first transmission clock signal to the transmitting cells 123a, 123b, and 123c, and may transmit the second transmission data and the second transmission clock signal to the transmitting cells 123d, 123e and 123f. Here, the first transmission data indicates H, and the second transmission data indicates L. Conversely, the first transmission data may indicate L, and the second transmission data may indicate H.

(7) The semiconductor device shown in each Embodiment described above may be used for a digital still camera, a digital video camera, a mobile phone, a playback apparatus that plays back a content recorded on a recording medium such as a DVD and a BD, a digital broadcast reception apparatus, a digital content recording apparatus (video recorder), a video display apparatus (digital television), a personal computer and the like.

(8) According to the Embodiments described above, the three conductors adhere to the upper surface of the propagation plate 101a, and the two conductors adhere to the upper surfaces of the propagation plate 101b and the propagation plate 101c. However, the number of the propagation plates is not limited to the above.

One conductor may adhere to the upper surface of a propagation plate, and four or more propagation plates may adhere to the upper surface of a propagation plate.

(9) The above Embodiments and modifications may be combined with one another.

4. As described above, the present invention is a semiconductor device comprising: a semiconductor chip including a transmitting cell, a receiving cell, a first antenna connected to the transmitting cell, and a second antenna connected to the receiving cell; and a conductor disposed close to the first antenna and the second antenna, wherein the transmitting cell and the receiving cell communicate with each other using close proximity wireless communication The above structure has the advantageous effect of changing the setting of the internal operation mode without increasing the number of terminals of the semiconductor device.

Here, the first antenna and the second antenna may be each a coiled metal wire, and the first antenna and the second antenna may be inductively coupled with each other via the conductor.

Here, a sheet having the conductor may adhere to a surface of the semiconductor chip.

Here, the semiconductor chip may be disposed on a circuit substrate, and the conductor may be disposed on the circuit substrate.

Here, the transmitting cell may output a first electrical signal to the first antenna, the first electrical signal being at a potential that changes from a first potential to a second potential, the receiving cell may detect a second electrical signal, the second electrical signal being at a potential that changes, and the semiconductor chip may further include a switching cell that switches between operation modes when the receiving cell detects the second electrical signal.

In addition, the present invention provides a signal propagation plate provided close to a semiconductor chip, the semiconductor chip including a transmitting cell, a receiving cell, a first antenna connected to the transmitting cell, and a second antenna connected to the receiving cell, the propagation plate comprising: a conductor disposed close to the first antenna and the second antenna, wherein the transmitting cell and the receiving cell communicate with each other using close proximity wireless communication.

INDUSTRIAL APPLICABILITY

The semiconductor device using close proximity wireless communication pertaining to the present invention is able to change the setting of the internal operation mode without increasing the number of terminals of the semiconductor device, and is applicable to the setting of the operation mode of the semiconductor device, for example. In particular, the semiconductor device is useful when applied to many types of apparatuses (digital television, video recorder, mobile phone and the like).

REFERENCE SIGNS LIST 10a, 10b, 10c, 10d circuit substrate
100a, 100b, 100c, 100d semiconductor device
101a, 101b, 101c, 101d propagation plate
111a, 111b, 111c, 111d conductor
111e, 111f, 111g conductor
120, 120d semiconductor chip
121a, 121b, 121c, 121d, 121e, 121f transmitting antenna
122a, 122b, 122c receiving antenna
123a, 123b, 123c, 123d, 123e, 123f transmitting cell
124a, 124b, 124c receiving cell
125a, 125b, 125c, 125d, 125e, 125f generating cell
126 first storage cell
127 second storage cell
128 third storage cell
130 interface cell
131 logical block
150, 150d package

The invention claimed is:

1. A semiconductor device, comprising:
a semiconductor chip including a transmitting cell, a receiving cell, a first antenna connected to the transmitting cell, and a second antenna connected to the receiving cell, the first antenna and the second antenna being disposed on a surface of the semiconductor chip with a separation therebetween; and
a band-like foil conductor having one end disposed close to the first antenna and having another end disposed close to the second antenna, such that the one end of the conductor is disposed closer to the first antenna than the second antenna and the other end of the conductor is disposed closer to the second antenna than the first antenna, wherein
the transmitting cell and the receiving cell communicate with each other using close proximity wireless communication,
the first antenna and the second antenna are each a coiled metal wire,
the first antenna and the second antenna are inductively coupled with each other via the conductor,
the transmitting cell outputs a first electrical signal to the first antenna, the first electrical signal being at a potential that changes from a first potential to a second potential,
the receiving cell detects a second electrical signal, the second electrical signal being at a potential that changes,
the semiconductor chip further includes a switching cell that switches between operation modes when the receiving cell detects the second electrical signal,
the semiconductor chip is disposed on a circuit substrate,
the circuit substrate includes a bus and a flash memory,
the potential of the second electrical signal indicates a bus width, a flash memory type, or a flash memory operation mode,
the semiconductor chip further includes a logical block,
the switching cell switches the bus width, the flash memory type, or the flash memory operation mode in response to the second electrical signal, and
the logical block performs an input/output of data with the flash memory, via the bus, in accordance with the bus width, the flash memory type, or the flash memory operation type after the switching thereof.

2. The semiconductor device of claim 1, wherein
the semiconductor chip further comprises a sheet including the conductor,
the sheet is adhered to a surface of the semiconductor chip, and
the sheet is a flexible film that covers the surface of the semiconductor chip.

3. The semiconductor device of claim 1, wherein
the conductor is disposed on a circuit substrate, and
the semiconductor chip is disposed on the circuit substrate and covers the conductor.

4. A semiconductor device, comprising:
a semiconductor chip including a transmitting cell, a receiving cell, a first antenna connected to the transmitting cell, and a second antenna connected to the receiving cell, the first antenna and the second antenna being disposed on a surface of the semiconductor chip with a separation therebetween; and
a band-like foil conductor having one end disposed close to the first antenna and having another end disposed close to the second antenna, such that the one end of the conductor is disposed closer to the first antenna than the second antenna and the other end of the conductor is disposed closer to the second antenna than the first antenna, wherein the transmitting cell and the receiving cell communicate with each other using close proximity wireless communication, the first antenna and the second antenna are each a coiled metal wire, the first antenna and the second antenna are inductively coupled with each other via the conductor, the transmitting cell outputs a first electrical signal to the first antenna, the first electrical signal being at a potential that changes from a first potential to a second potential, the receiving cell detects a second electrical signal, the second electrical signal being at a potential that changes, the semiconductor chip further includes a switching cell that switches between operation modes when the receiving cell detects the second electrical signal, the semiconductor chip further includes a first cell, a second cell and a third cell, and the switching cell switches between connection of the first cell with the second cell and connection of the first cell with the third cell in response to the second electrical signal.

5. The semiconductor device of claim 4, wherein the second cell is a cell for normal operation and the third cell is a cell for outputting a test signal.

* * * * *